(12) United States Patent
Jang

(10) Patent No.: US 12,389,697 B2
(45) Date of Patent: Aug. 12, 2025

(54) IMAGE SENSING DEVICE WITH REDUCED POWER CONSUMPTION BY CONSTRAINING THE PHOTOCURRENT

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 625 days.

(21) Appl. No.: 17/499,630

(22) Filed: Oct. 12, 2021

(65) Prior Publication Data
US 2022/0208815 A1 Jun. 30, 2022

(30) Foreign Application Priority Data
Dec. 29, 2020 (KR) .................. 10-2020-0186487

(51) Int. Cl.
*H10F 39/00* (2025.01)
*H10F 39/18* (2025.01)

(52) U.S. Cl.
CPC ......... *H10F 39/8037* (2025.01); *H10F 39/18* (2025.01); *H10F 39/8033* (2025.01); *H10F 39/8063* (2025.01); *H10F 39/807* (2025.01)

(58) Field of Classification Search
CPC ......... H01L 27/146–14698; H10F 39/803–803
See application file for complete search history.

(56) References Cited

U.S. PATENT DOCUMENTS

| 10,310,060 | B2 | 6/2019 | Na et al. |
| 10,418,407 | B2 * | 9/2019 | Na ................. H01L 27/14612 |
| 2013/0258144 | A1 | 10/2013 | Chen et al. |
| 2014/0231879 | A1 | 8/2014 | Meynants et al. |

(Continued)

FOREIGN PATENT DOCUMENTS

| CN | 101872775 A | 10/2010 |
| CN | 104505394 A | 4/2015 |

(Continued)

OTHER PUBLICATIONS

Chinese Patent Office, First Office Action for CN Appl. No. 202111148928.0, mailed on Dec. 6, 2023, 25 pages with English Translation.

(Continued)

*Primary Examiner* — Christine S. Kim
*Assistant Examiner* — Tyler J Wiegand
(74) *Attorney, Agent, or Firm* — Perkins Coie LLP

(57) ABSTRACT

An image sensing device may include: a substrate including a back side and a front side; imaging pixels configured to receive incident light from the back side and each structured to produce photocharge in response to the received incident light at each imaging pixel; a plurality of taps located at a depth from the front side of the substrate and configured to generate a current within the substrate and capture photocharge generated by the imaging pixels and migrated by the current, wherein the plurality of taps is distributed in the imaging pixels such that two or more of the plurality of taps are located within each imaging pixel; and a capping region formed in each imaging pixel to surround the two or more taps included in each imaging pixel, wherein a lower portion of the capping region is spaced apart from the back side by a predetermined distance.

17 Claims, 8 Drawing Sheets

(56) References Cited

U.S. PATENT DOCUMENTS

| | | | |
|---|---|---|---|
| 2017/0194367 A1* | 7/2017 | Fotopoulou | H01L 27/14609 |
| 2018/0211990 A1 | 7/2018 | Yorikado et al. | |
| 2018/0247968 A1 | 8/2018 | Na et al. | |
| 2020/0020731 A1* | 1/2020 | Watanabe | G01S 7/4863 |
| 2020/0028017 A1 | 1/2020 | Imoto et al. | |
| 2022/0068983 A1* | 3/2022 | Yamazaki | G01B 11/22 |

FOREIGN PATENT DOCUMENTS

| | | |
|---|---|---|
| CN | 205159324 U | 4/2016 |
| CN | 110649975 A | 1/2020 |
| CN | 110729315 A | 1/2020 |
| CN | 111466027 A | 7/2020 |
| EP | 2768024 A1 | 8/2014 |
| EP | 3723133 A1 | 10/2020 |
| JP | 2018117117 A | 7/2018 |
| KR | 20030081650 A | 10/2003 |
| KR | 20120015257 A | 2/2012 |
| KR | 10-2017-0040124 A | 4/2017 |
| KR | 10-2020-0130074 A | 11/2020 |
| WO | 2015170628 A1 | 11/2015 |
| WO | 2018187402 A1 | 10/2018 |
| WO | 2020110695 A1 | 6/2020 |
| WO | 2020158322 A1 | 12/2021 |

OTHER PUBLICATIONS

Notification to Grant Patent Right for Invention mailed on May 13, 2024 for CN Appl. No. 202111148928.0, 7 pages with English translation.

Request for the Submission of an Opinion for KR Appl. No. 10-2020-0186487, mailed on Jan. 23, 2025, 17 pages with English translation.

* cited by examiner

IMAGE SENSING DEVICE WITH REDUCED POWER CONSUMPTION BY CONSTRAINING THE PHOTOCURRENT

CROSS-REFERENCES TO RELATED APPLICATION

This patent document claims the priority and benefits of Korean application number 10-2020-0186487, filed on Dec. 29, 2020, which is incorporated herein by reference in its entirety.

TECHNICAL FIELD

Various embodiments generally relate to an image sensing device for sensing a distance to a target object.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

The embodiments of the disclosed technology relate to an image sensing device including time of flight (ToF) pixels that are structured to avoid unnecessary power consumption.

In an embodiment, an image sensing device may include: a substrate including a back side structured to receive incident light and a front side facing away from the back side; imaging pixels configured to receive the incident light from the back side and each structured to produce photocharge in response to the received incident light at each imaging pixel; a plurality of taps located at a depth from the front side of the substrate and configured to generate a current within the substrate and capture photocharge which is generated by the imaging pixels and migrated by the current, wherein the plurality of taps is distributed in the imaging pixels such that two or more of the plurality of taps are located within each imaging pixel; and a capping region formed in each imaging pixel and structured to surround the two or more taps included in each imaging pixel, wherein a lower portion of the capping region is spaced apart from the back side by a predetermined distance.

In an embodiment, an image sensing device may include: a substrate; and a first pixel and a second pixel adjacent to each other, disposed at the substrate and structured to convert incident light into electrical signals, respectively, wherein each of the first and second pixels comprises: a plurality of taps each configured to generate a current within the substrate, and capture photocharges that are generated by the incident light and migrated by the current; and a capping region structured to surround the taps, wherein the capping region of the first pixel and the capping region of the second pixel are physically isolated from each other.

In an embodiment, an image sensing device may include: a substrate including a back side on which light is incident and a front side facing the back side; a plurality of taps disposed to abut on the front side, and configured to generate a pixel current within the substrate and capture photocharges which are generated by the light and migrated by the pixel current; and a capping region configured to surround the taps included in the same pixel, and spaced by a predetermined distance apart from the back side.

In an embodiment, an image sensing device may include: a substrate including a back side structured to receive incident light and a front side facing away from the back side; imaging pixels supported by the substrate to receive the incident light from the back side and each structured to produce photocharge in response to the received incident light at each imaging pixel; a plurality of taps supported by the substrate and located a depth in the substrate from the front side and configured to generate a current within the substrate and capture photocharge which is generated by the imaging pixels and migrated by the current, wherein the plurality of taps is distributed in the imaging pixels such that two or more of the plurality of taps are located within each imaging pixel; and a capping region formed in each imaging pixel and structured to surround the two or more taps included in each imaging pixel, wherein a lower portion of the capping region is spaced apart from the back side by a predetermined distance.

In an embodiment, an image sensing device may include: a substrate; and a first pixel and a second pixel adjacent to each other, supported by the substrate and structured to convert incident light into electrical signals, respectively, wherein each of the first and second pixels comprises: a plurality of taps each configured to generate a current within the substrate, and capture photocharges that are generated by the incident light and migrated by the current; and a capping region structured to surround the taps, wherein the capping region of the first pixel and the capping region of the second pixel are physically isolated from each other.

In an embodiment, an image sensor device includes a first pixel and a second pixel, which are adjacent to each other. Each of the first and second pixels may include: taps each configured to generate a pixel current within a substrate, and capture photocharges which are generated by incident light and migrated by the pixel current; and a capping region configured to surround the taps, wherein the capping region of the first pixel and the capping region of the second pixel are physically isolated from each other.

The disclosed technology can be implemented in some embodiments to improve the performance of ToF pixels while reducing power consumed for the ToF pixels.

DETAILED DESCRIPTION

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

The three-dimensional (3D) sensing is a growing research field that includes methods for acquiring the depth information by using an image sensor in various applications such as security devices, medical devices, vehicles, game machines, virtual reality (VR)/augmented reality (AR) devices, and mobile device. Examples of 3D sensing that can measure the depth of an image may include triangulation, time of flight (ToF) and interferometry. The ToF method, among others, is used in many applications because it has a wide range of applications, a high processing speed, and a cost efficiency. In some implementations, the TOF method measures a distance using emitted light from the light source and reflected light from the object. Some implementations of the ToF method may be roughly classified into a direct method and an indirect method, depending on whether a round-trip time or a phase difference of light is used to determine the distance between the ToF sensor and an object. The direct method may measure the distance between the ToF sensor and an object by calculating a round trip time of light, whereas the indirect method may measure the distance between the ToF sensor and the object using a phase difference. The direct TOF sensor is generally used for automobiles because it is advantageous for long distance measurement. The indirect TOF sensor is used for a game machine or a mobile camera that is used at a shorter distance and requires a faster processing speed. The indirect TOF sensor can be implemented using a simple circuit at a low cost.

In some implementations, the indirect ToF sensor may utilize a current-assisted photonic demodulator (CAPD) technique by which electrons generated in a sensor pixel by using a majority current that is created through an application of a substrate voltage are detected by using an electric potential difference between electric fields. Since the majority current is used, the CAPD can rapidly detect electrons. In addition, the CAPD has an excellent efficiency by detecting electrons that are formed at a deep depth.

Figure 1:
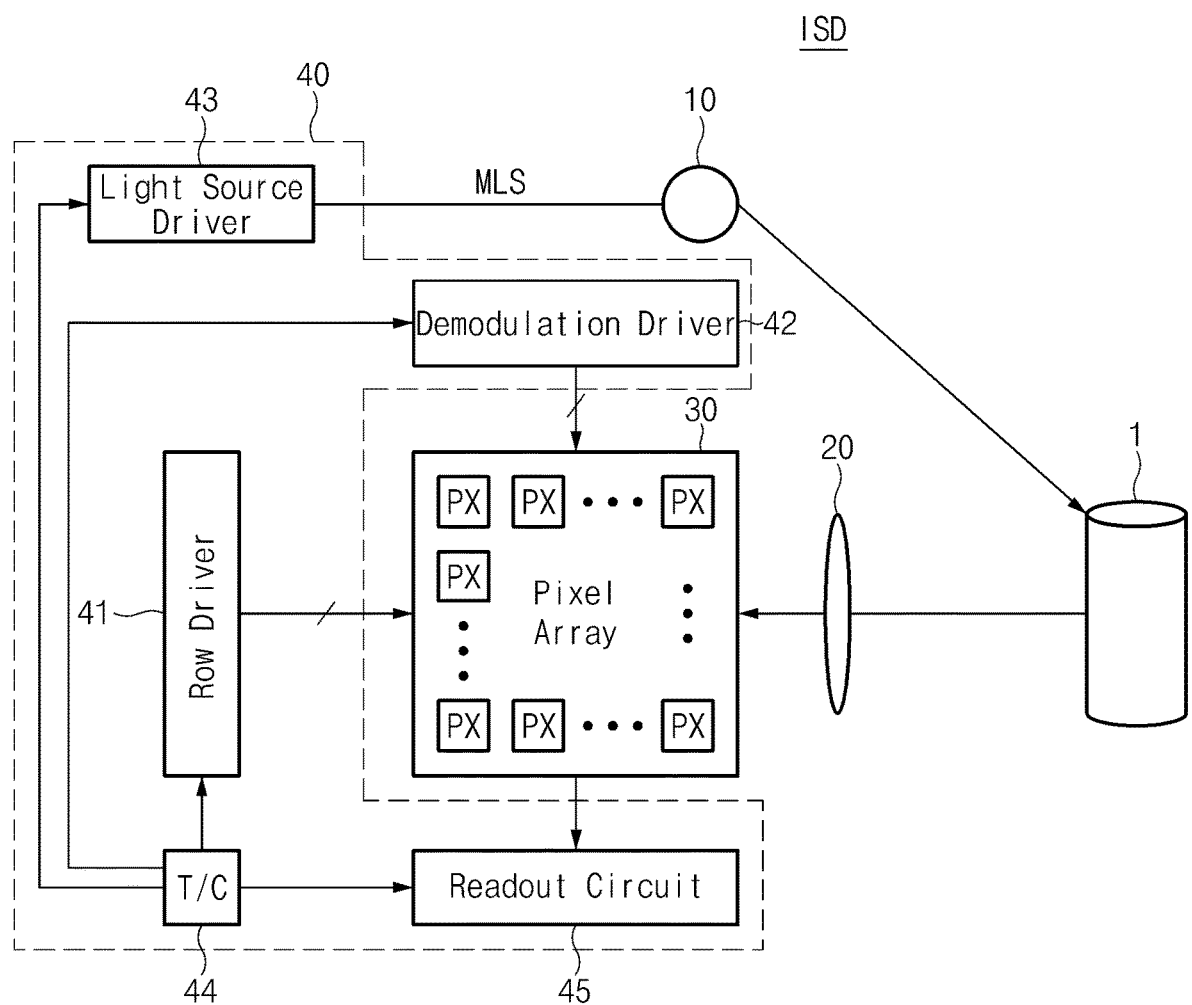
FIG. 1 is a diagram illustrating an example configuration of an image sensing device based on an embodiment of the disclosed technology.

FIG. 1 is a block diagram illustrating an example of an image sensing device ISD based on some implementations of the disclosed technology.

Referring to FIG. 1, the image sensing device ISD may measure the distance between the image sensing device ISD and a target object 1 using the TOF method. The TOF method based on some implementations may be a direct TOF method or an indirect TOF method. In some implementations, the direct TOF method may measure the distance between the image sensing device ISD and an object by measuring a time duration between the emission of light from a light source toward the target object 1 and the arrival of light that is reflected from the target object 1 and returns to the image sensing device ISD. In other implementations, the indirect TOF method may measure the distance between the image sensing device ISD and an object by emitting modulated light to the target object 1, sensing light reflected from the target object 1, and calculating a phase difference between the modulated light and the reflected light. Although the image sensing device ISD using the indirect TOF method is described in this patent document, the image sensing device ISD may also use the direct TOF method. In this patent document, the target object 1 may include an object or scene or person photographed by the image sensing device ISD.

The image sensing device ISD may include a light source 10, a lens module 20, a pixel array 30, and a control block 40.

The light source 10 emits light onto the target object 1 in response to a light modulation signal MLS received from the control block 40 as a control signal which is fed into the light source 10 to cause light modulation in the light emitted by the light source for illuminating the target object 1. The light source 10 may be an LD (laser Diode) or LED (Light Emitting Diode) which emits a specific wavelength range of light (for example, near-infrared light, infrared light or visible light), NIR (Near Infrared Laser), a point light source, a white lamp, a monochromatic light source having monochromators combined therein, or a combination of other laser light sources. For example, the light source 10 may emit infrared light having a wavelength of 800 nm to 1,000 nm. The light emitted from the light source 10 may be modulated at a predetermined frequency in response to the light modulation signal MLS. FIG. 1 illustrates only one light source 10, for convenience of description. However, a plurality of light sources may be arranged around the lens module 20.

The lens module 20 may collect light reflected from the target object 1 and focus the collected light on pixels PX of the pixel array 30. For example, the lens module 20 may include a focusing lens with a glass or plastic surface or a cylindrical optical element. The lens module 20 may include a plurality of lenses aligned with an optical axis.

The pixel array 30 may include a plurality of unit pixels PX which are successively arranged in a 2D matrix, for example, a plurality of unit pixels PX which are successively arranged in column and row directions. The unit pixels PX may be formed on a semiconductor substrate, and each of the unit pixels PX may convert light that is incident through the lens module 20 into an electrical signal corresponding to the intensity of the light, and output the electrical signal as a pixel signal. In this case, the pixel signal may be a signal indicating the distance to the target object 1. For example, each unit pixel (PX) may be a Current-Assisted Photonic Demodulator (CAPD) pixel or a Quantum Efficiency Modulation (QEM) pixel. Although the CAPD pixel is described as an example, other implementations are also possible. Thus, the disclosed technology can also be applied to QEM pixels or any other pixels. The structure and operations of each unit pixel (PX) will hereinafter be described with reference to FIG. 2.

The control block 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control block 40 may include a row driver 41, a demodulation driver 42, a light source driver 43, a timing controller (T/C) 44, and a readout circuit 45.

The row driver 41 and the demodulation driver 42 may be generically called a control circuit for convenience of description.

The control circuit may drive unit pixels (PXs) of the pixel array 30 in response to a timing signal generated from the timing controller 44.

The control circuit may generate a control signal capable of selecting and controlling at least one row line from among the plurality of row lines. The control signal may include a demodulation control signal for generating a hole current in the substrate, a reset signal for controlling a reset transistor, a transmission (Tx) signal for controlling transmission of photocharges accumulated in a detection node, a floating diffusion (FD) signal for providing additional electrostatic capacity at a high illuminance level, a selection signal for controlling a selection transistor and/or others. The pixel current may refer to a current for moving photocharges generated by the substrate to the detection node.

In some implementations, the row driver 41 may generate a reset signal, a transmission (Tx) signal, a floating diffusion (FD) signal, and a selection signal, and the demodulation driver 42 may generate a demodulation control signal. Although the row driver 41 and the demodulation driver 42 based on some implementations of the disclosed technology are configured independently of each other, the row driver 41 and the demodulation driver 42 based on some other implementations may be implemented as one constituent element that can be disposed at one side of the pixel array 30 as needed.

The light source driver 43 may generate the light modulation signal MLS capable of driving the light source 10, under control of the timing controller 44. The light modulation signal MLS may be a signal modulated at a predetermined frequency.

The timing controller 44 may generate a timing signal for controlling the operations of the row driver 41, the demodulation driver 42, the light source driver 43 and the readout circuit 45.

The readout circuit 45 may generate pixel data in the form of digital signals by processing pixel signals outputted from the pixel array 30, under control of the timing controller 44. For this operation, the readout circuit 45 may include a CDS (Correlated Double Sampler) for performing correlated double sampling on the pixel signals outputted from the pixel array 30. The readout circuit 45 may include an analog-digital converter for converting the output signals from the CDS into digital signals. Furthermore, the readout circuit 45 may include a buffer circuit for temporarily storing pixel data outputted from the analog-digital converter and outputting the pixel data to the outside under control of the timing controller 44. As the pixel array 30 is composed of CAPD pixels, each column of the pixel array 30 may include two column lines for transferring pixel signals, and components for processing pixel signals outputted from the column lines may also be provided for the respective column lines.

The light source 10 may emit light, modulated at a predetermined frequency, toward a scene captured by the image sensing device ISD, and the image sensing device ISD may sense modulated light (i.e. incident light) reflected from target objects 1 within the scene, and generate depth information on each of the unit pixels PX. The modulated light and the incident light have a time delay present therebetween, due to the distance between the image sensing device ISD and the target object 1. Such a time delay appears as a phase difference between a signal generated by the image sensing device ISD and the light modulation signal MLS for controlling the light source 10. An image processor (not illustrated) may generate a depth image containing depth information on each of the unit pixels PX by calculating a phase difference which occurs in a signal outputted from the image sensing device ISD.

Figure 2:
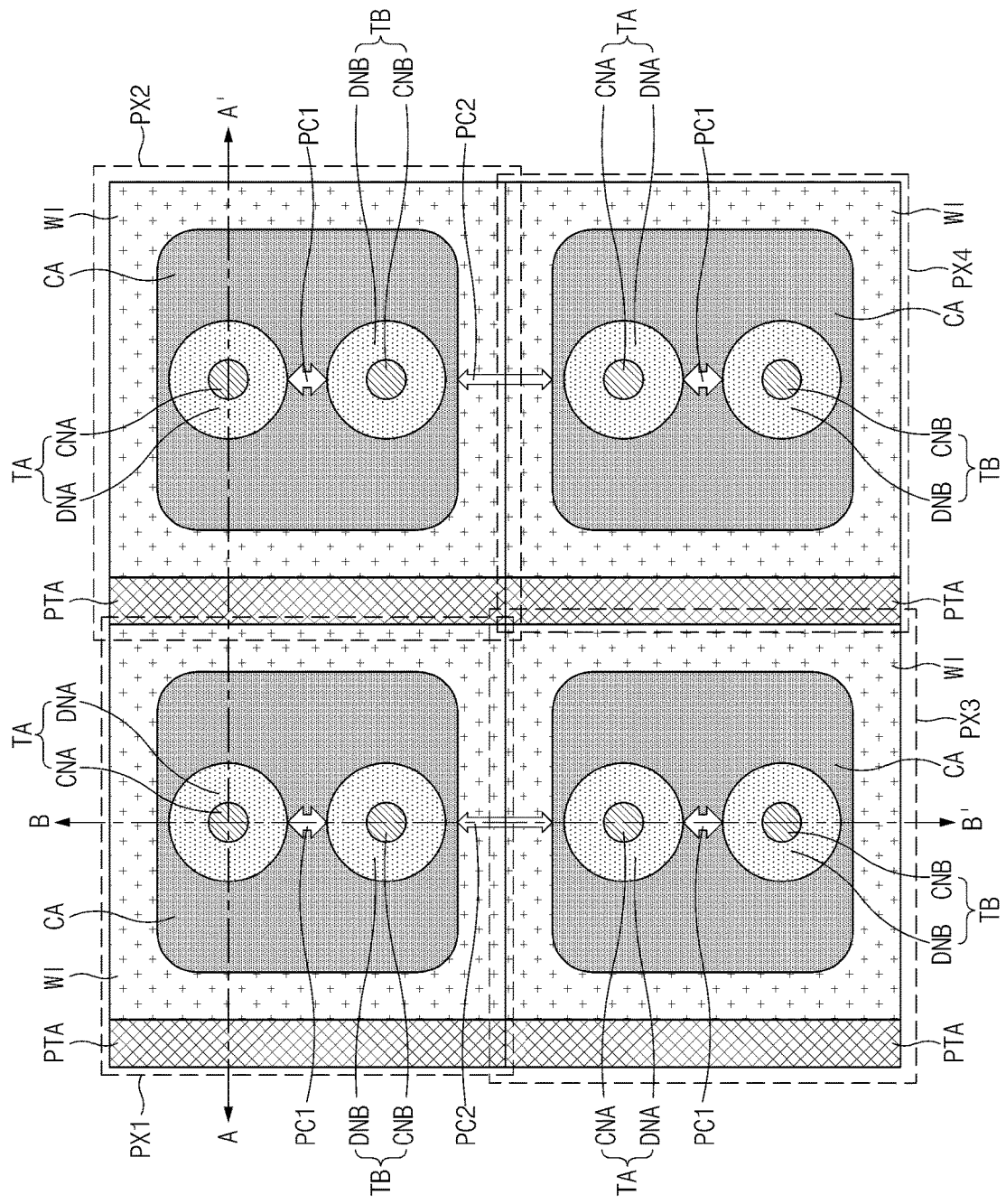
FIG. 2 is a diagram illustrating an example of the layout of a pixel illustrated in FIG. 1.

FIG. 2 is a diagram briefly illustrating an example of the layout of a pixel illustrated in FIG. 1.

In some implementations, first to fourth pixels PX1 to PX4 may be part of the pixels PX illustrated in FIG. 1. For convenience of description, only four pixels PX1 to PX4 are illustrated in FIG. 2 by way of example. In some implementations, other pixels arranged in the pixel array 30 may have the same structure and operate in the same way as the pixels PX1 to PX4 illustrated in FIG. 2.

In some implementations, the first to fourth pixels PX1 to PX4 may be arranged in a 2×2 matrix array, and the structure of the first pixel PX1 as will be discussed below may be identical or similar to the other pixels PX2 to PX4.

In some implementations, each pixel may include one or more tap structures. Each tap structure may include a control node and a detection node structured to surround the control node. In one example, the control node is doped with P type impurity, and the detection node is doped with N type impurity. In some implementations, the first pixel PX1 may include a first tap TA, a second tap TB, a capping region CA, a well isolation region WI and a pixel transistor region PTA. In some implementations of the disclosed technology, each of the pixels PX1 to PX4 includes two taps TA and TB. In other, each pixel may include three or more taps. Different taps may receive the same or different types of demodulation control signals or receive demodulation control signals at the same timing or different timings. In some embodiments of the disclosed technology, each of the taps may be used to receive or output an electrical signal, and may be referred to as an electrical contact tap.

As illustrated in FIG. 2, in some implementations, the first and second taps TA and TB may be arranged in a vertical direction (column direction). In other embodiments of the disclosed technology, the first and second taps TA and TB may be arranged in a horizontal direction (row direction) or diagonal direction.

The first tap TA may include a first control node CNA and a first detection node DNA surrounding the first control node CNA. As illustrated in FIG. 2, in some implementations, the first control node CNA may have a circular shape, and the first detection node DNA may have a ring shape. However, the first control node CNA may have any shape and the first detection node DNA may have any shape that surrounds the first control node CNA. The ring shape that surrounds the first control node CNA may allow the first detection node DNA to have increase or maximize the contact area between the first control node CNA and the first detection node DNA. The increased or maximized contact area may allow the first detection node DNA to easily capture charge carriers that form a pixel current between the first detection node DNA and the first control node CNA.

The first control node CNA and the first detection node DNA may be disposed to abut or face each other or may be in contact with each other. The first control node CNA and the first detection node DNA may be isolated from each other by counter doping the first control node CNA and the first detection node DNA, creating a junction isolation.

The second tap TB may include a second control node CNB and a second detection node DNB surrounding the second control node CNB. The structures of the second control node CNB and the second detection node DNB may be similar or identical to those of the first control node CNA and the first detection node DNA.

The first and second control nodes CNA and CNB may include regions that are doped with a P-type impurity, and the first and second detection nodes DNA and DNB may include regions that are doped with an N-type impurity. In the disclosed technology, the P-type may be defined as a first conductive type, and the N-type may be defined as a second conductive type.

The capping region CA may be disposed to surround the first and second taps TA and TB and constrain the path of a current flowing between the first and second taps TA and TB. The capping region CA may include a well region doped with a P-type impurity at a lower doping concentration than the first and second control nodes CNA and CNB. In some implementations, the capping region CA is physically isolated from the pixel transistor region PTA and the capping regions CA of adjacent pixels such as the second and third pixels PX2 and PX3.

The disclosed technology can be implemented in some embodiments to divide pixels into groups of pixels using well isolation regions disposed along boundaries between adjacent pixels. The well isolation region WI may be disposed, for example, between the capping region CA and the pixel transistor region PTA to electrically isolate the capping region CA and the pixel transistor region PTA from each other, and between the capping regions CA of adjacent pixels (e.g., PX1 and PX3) to electrically isolate the capping regions CA from each other. The well isolation region WI may be formed by filling a trench created through an STI (Shallow Trench Isolation) process with a dielectric material. The dielectric material may include one or more of silicon oxynitride ($Si_xO_yN_z$), silicon oxide ($Si_xO_y$) and silicon nitride ($Si_xN_y$) where x, y and z are natural numbers.

The pixel transistor region PTA may include pixel transistors (e.g., TX_A, RX_A, FDX_A, DX_A and SX_A of FIG. 3) for processing photocharges captured by the first tap TA and pixel transistors (e.g., TX_B, RX_B, FDX_B, DX_B and SX_B of FIG. 3) for processing photocharges captured by the second tap TB. In some implementations, the pixel transistors in the pixel transistor region PTA may be arranged along the boundary between adjacent pixels. In one example, the pixel transistors included in the pixel transistor region PTA may be arranged in a line along the boundary between pixels adjacent to each other.

Each of the transistors included in the pixel transistor region PTA may include a gate electrode, which is disposed on a dielectric layer formed on one surface of a substrate, impurity regions, which are disposed on both sides of the gate electrode in the substrate to be used as source and drain of the transistor, and a channel region corresponding to a lower region of the gate electrode in the substrate. The source and drain may be surrounded by a well region doped with a predetermined concentration of P-type impurity, and the well region may also be extended to the lower region of the gate electrode and thus form the body of each pixel transistor. The drawings following FIG. 2 illustrate only the well region for the pixel transistor region PTA for convenience of description.

The first tap TA, the second tap TB, the capping region CA and the source and drain and the well region of the pixel transistor region PTA may be formed by implanting a predetermined concentration of P-type or N-type impurity to a predetermined depth.

As illustrated in FIG. 2, a first pixel current PC1 may flow between the first and second taps TA and TB belonging to the same pixel (e.g., PX1), and a second pixel current PC2 may flow between the first and second taps TA and TB belonging to different pixels (e.g., PX3 and PX1). The arrows illustrated in FIG. 2 represent the first and second pixel currents PC1 and PC2, and the thicknesses of the arrows indicate the amount of current flowing from one point to another. In some implementations, the first pixel current PC1 may be larger than the second pixel current PC2. That is, the disclosed technology can be implemented in some embodiments to prevent a pixel current that migrates photocharges from flowing between different pixels (e.g., between PX3 and PX1), thereby reducing or minimizing crosstalk that would have occurred due to the migration of photocharges from one pixel to another pixel. Furthermore, the disclosed technology can be implemented in some embodiments to reduce the power consumption required for the pixel array 30 to generate the pixel current. The relationship between the amounts of the pixel currents may depend on the capping region CA, as will be discussed below with reference to FIGS. 4 and 5.

Figure 3:
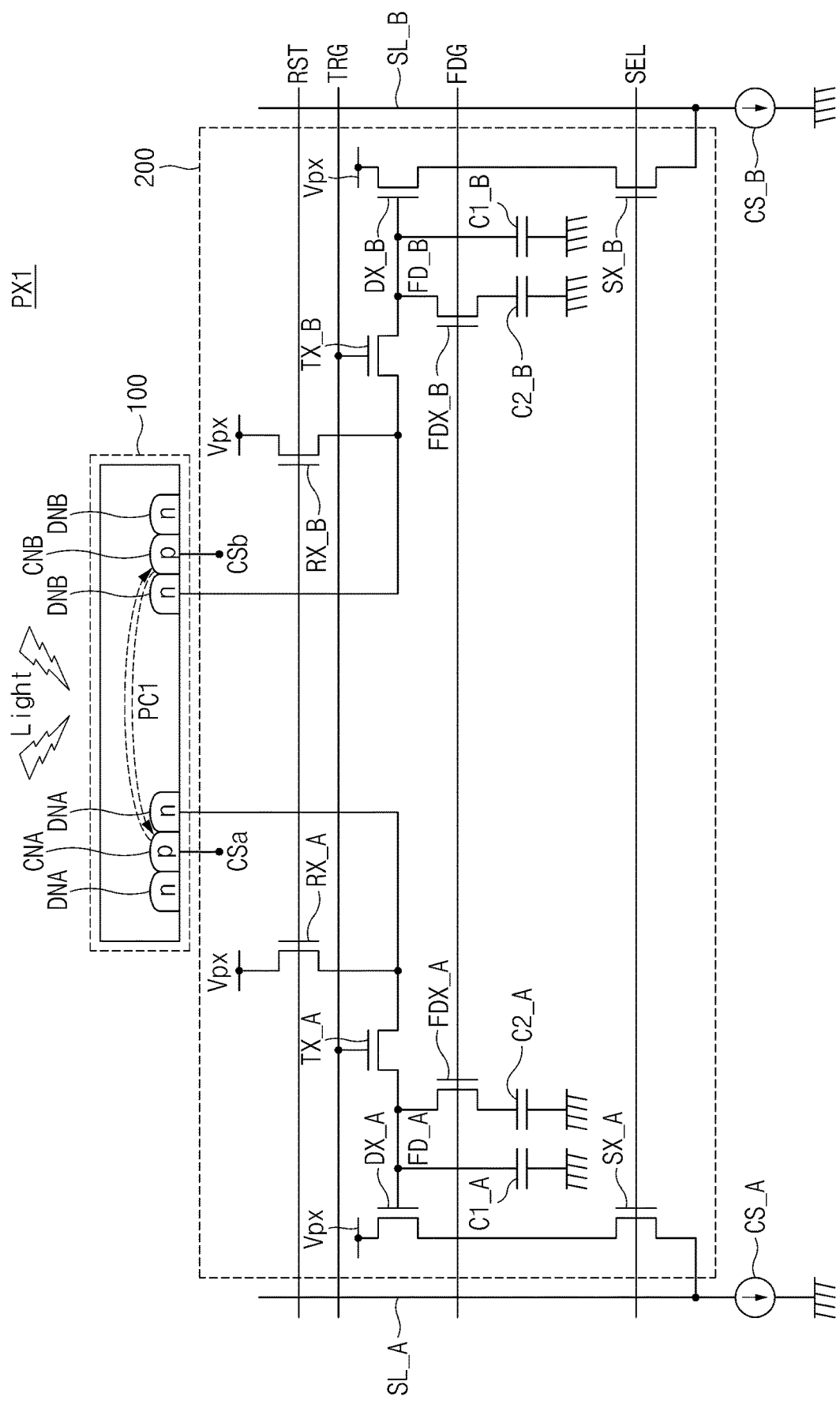
FIG. 3 illustrates an operation of a first pixel illustrated in FIG. 2.

FIG. 3 illustrates an operation of a first pixel illustrated in FIG. 2.

Referring to FIG. 3, the first pixel PX1 may include, among others, a photoelectric conversion region 100 and a circuit region 200.

The photoelectric conversion region 100 corresponds to a cross-section of the pixel PX taken along a line B-B' (part of the line B-B') passing through the first and second taps TA and TB in FIG. 2. FIG. 3 illustrates components of the photoelectric conversion region 100 that are used perform a photoelectric conversion operation, among the components of the first pixel PX1.

The photoelectric conversion region 100 may include the first and second control nodes CNA and CNB and the first and second detection nodes DNA and DNB. The first control node CNA and the first detection node DNA may constitute the first tap (or a first demodulation node), and the second control node CNB and the second detection node DNB may constitute the second tap (or a second demodulation node).

The first and second control nodes CNA and CNB and the first and second detection nodes DNA and DNB may be formed in a semiconductor substrate.

The first and second control nodes CNA and CNB may receive first and second demodulation control signals CSa and CSb, respectively, from the demodulation driver 42. A voltage difference between the first and second demodulation control signals CSa and CSb generates the first pixel current PC1 to control a flow of charge carriers generated in the substrate by incident light. When the voltage of the first demodulation control signal CSa is higher than that of the second demodulation control signal CSb, the first pixel current PC1 flows from the first control node CNA to the second control node CNB. When the voltage of the first demodulation control signal CSa is lower than that of the second demodulation control signal CSb, the first pixel current PC1 flows from the second control node CNB to the first control node CNA.

Each of the first and second detection nodes DNA and DNB may capture and accumulate charge carriers that carry electric currents (e.g., pixel current) along the flow of the first pixel current PC1.

In an embodiment, the photocharge is captured by the photoelectric conversion region 100 during sequential first and second intervals.

In the first interval, light incident on the first pixel PX1 may be converted into electro-hole pairs corresponding to the intensity of the incident light. In some implementations of the disclosed technology, the electron generated in response to the intensity of the incident light may indicate photocharge. The demodulation driver 42 may apply the first demodulation control signal CSa to the first control node CNA, and apply the second demodulation control signal CSb to the second control node CNB. Here, the voltage of the first demodulation control signal CSa may be higher than that of the second demodulation control signal CSb. Here, the voltage of the first demodulation control signal CSa may be defined as an active voltage, and the voltage of the second demodulation control signal CSb may be defined as an inactive voltage. For example, the voltage of the first demodulation control signal CSa may be 1.2 V, and the voltage of the second demodulation control signal CSb may be 0 V.

Due to a voltage difference between the first and second demodulation control signals CSa and CSb, an electric field may be generated between the first and second control nodes CNA and CNB, and the first pixel current PC1 may flow from the first control node CNA to the second control node CNB. That is, holes within the substrate may migrate toward the second control node CNB, and electrons within the substrate may migrate toward the first control node CNA.

Electrons may be generated in the substrate in response to the luminous intensity of incident light, and the generated electrons may be migrated toward the first control node CNA and captured by the first detection node DNA adjacent to the first control node CNA. Therefore, the electrons within the substrate may be used as charge carriers that carry electric currents corresponding to the luminous intensity of the incident light.

In the second interval following the first interval, light incident on the pixel PX may be converted into electrical currents by generating electron-hole pairs corresponding to the intensity of the incident light. The demodulation driver 42 may apply the first demodulation control signal CSa to the first control node CNA, and apply the second demodulation control signal CSb to the second control node CNB. Here, the voltage of the first demodulation control signal CSa may be lower than the voltage of the second demodulation control signal CSb. The voltage of the first demodulation control signal CSa may be defined as an inactive voltage, and the voltage of the second demodulation control signal CSb may be defined as an active voltage. For example, the voltage of the first demodulation control signal CSa may be 0 V, and the voltage of the second demodulation control signal CSb may be 1.2 V.

Due to a voltage difference between the first and second demodulation control signals CSa and CSb, an electric field may be generated between the first and second control nodes CNA and CNB, and the first pixel current PC1 may flow from the second control node CNB to the first control node CNA. That is, holes within the substrate may migrate toward the first control node CNA, and electrons within the substrate may migrate toward the second control node CNB.

That is, electrons may be generated in the substrate in response to the luminous intensity of incident light, and the generated electrons may be migrated toward the second control node CNB and captured by the second detection node DNB adjacent to the second control node CNB. Therefore, the electrons within the substrate may be used as signal carriers to detect the luminous intensity of the incident light.

In other implementations of the disclosed technology, the sequence of the first and second intervals may vary, and thus the first interval may follow the second interval.

The circuit region 200 may include a plurality of elements for converting the photocharges captured by the first detection node DNA and the second detection node DNB into electric signals by processing the photocharges. In some implementations, the plurality of elements may include transistors disposed in the pixel transistor region PTA of the first pixel PX1 of FIG. 2 and interconnect structured to electrically connect different elements. By way of example, the circuit region 200 will be discussed below with reference to a circuit diagram illustrated in FIG. 3. Control signals RST, TRG, FDG and SEL may be applied to the plurality of elements from the row driver 41. The pixel voltage Vpx may be a power supply voltage.

Photocharges captured by the first detection node DNA can be processed as discussed below. The circuit region 200 may include a reset transistor RX_A, a transmission transistor TX_A, a first capacitor C1_A, a second capacitor C2_A, a floating diffusion transistor FDX_A, a drive transistor DX_A and a selection transistor SX_A.

The reset transistor RX_A may be activated in response to a logic high level of a reset signal RST applied to a gate electrode thereof, and reset the electric potentials of a floating diffusion node FD_A and the first detection node DNA to a predetermined level (e.g., the pixel voltage Vpx). When the reset transistor RX_A is activated, the transmission transistor TX_A may be activated to reset the floating diffusion node FD_A.

The transmission transistor TX_A may be activated in response to a logic high level of a transmission signal TRG applied to a gate electrode thereof, and transmit the electrical charges that are accumulated in the first detection node DNA to the floating diffusion node FD_A.

The first capacitor C1_A may be coupled to the floating diffusion node FD_A and provide a predetermined capacitance.

The second capacitor C2_A may be selectively coupled to the floating diffusion node FD_A depending on the operation of the floating diffusion transistor FDX_A, and provide an additional predetermined capacitance.

Each of the first and second capacitors C1_A and C2_A may be configured as one or more of an MIM (Metal-Insulator-Metal) capacitor, MIP (Metal-Insulator-Poly silicon) capacitor, MOS (Metal-Oxide-Semiconductor) capacitor and junction capacitor.

The floating diffusion transistor FDX_A may be activated in response to a logic high level of a floating diffusion signal FDG applied to a gate electrode thereof, and couple the second capacitor C2_A to the floating diffusion node FD_A.

Under a high luminance condition in which the luminous intensity of incident light is relatively high, the row driver 41 may activate the floating diffusion transistor FDX_A to couple the floating diffusion node FD_A to the second capacitor C2_A. Thus, under such a high luminance condition, the floating diffusion node FD_A can accumulate more photocharges, which makes it possible to secure a high dynamic range.

Under a low luminance condition in which the luminous intensity of incident light is relatively low, the row driver 41 may inactivate the floating diffusion transistor FDX_A to isolate the floating diffusion node FD_A and the second capacitor C2_A from each other.

In another embodiment of the disclosed technology, the floating diffusion transistor FDX_A and the second capacitor C2_A may be omitted.

The drive transistor DX_A may have a drain electrode coupled to the pixel voltage Vpx and a source electrode coupled to a vertical signal line SL_A through the selection transistor SX_A, thereby constituting a source follower circuit with a load MOS of a constant current source circuit CS_A coupled to one end of the vertical signal line SL_A. That is, the driver transistor DX_A may output a current, corresponding to the potential of the floating diffusion node FD_A coupled to a gate electrode thereof, to the vertical signal line SL_A through the selection transistor SX_A.

The selection transistor SX_A may be activated in response to a logic high level of a selection signal SEL applied to a gate electrode thereof, and output a pixel signal, outputted from the drive transistor DX_A, to the vertical signal line SL_A.

In order to process photocharges captured by the second detection node DNB, the circuit region 200 may include a reset transistor RX_B, a transmission transistor TX_B, a first capacitor C1_B, a second capacitor C2_B, a floating diffusion transistor FDX_B, a drive transistor DX_B and a selection transistor SX_B. In some implementations, the elements for processing the photocharges captured by the second detection node DNB are configured and operated in the same manner as the above-described elements for processing the photocharges captured by the first detection node DNA except operation timings.

The pixel signals outputted to the vertical signal lines SL_A and SL_B, respectively, from the circuit region 200 may be converted into image data by removing noise from analog signals and converting the analog signals to digital signals at the readout circuit 45.

FIG. 3 illustrates that each of the reset signal RST, the transmission signal TRG, the floating diffusion signal FDG and the selection signal SEL is applied through one signal line. However, each of the reset signal RST, the transmission signal TRG, the floating diffusion signal FDG and the selection signal SEL may be applied through a plurality of signal lines (for example, two signal lines) such that the elements for processing the photocharges captured by the first detection node DNA and the elements for processing the photocharges captured by the second detection node DNB are operated at different timings.

An image processor (not illustrated) may calculate a phase difference based on the image data acquired from the photocharges captured by the first detection node DNA and the image data acquired from the photocharges captured by the second detection node DNB, calculate depth information that indicates the distance between the image sensor and the target object 1 based on a phase difference corresponding to each pixel, and generate a depth image including the depth information corresponding to each pixel.

Figure 4:
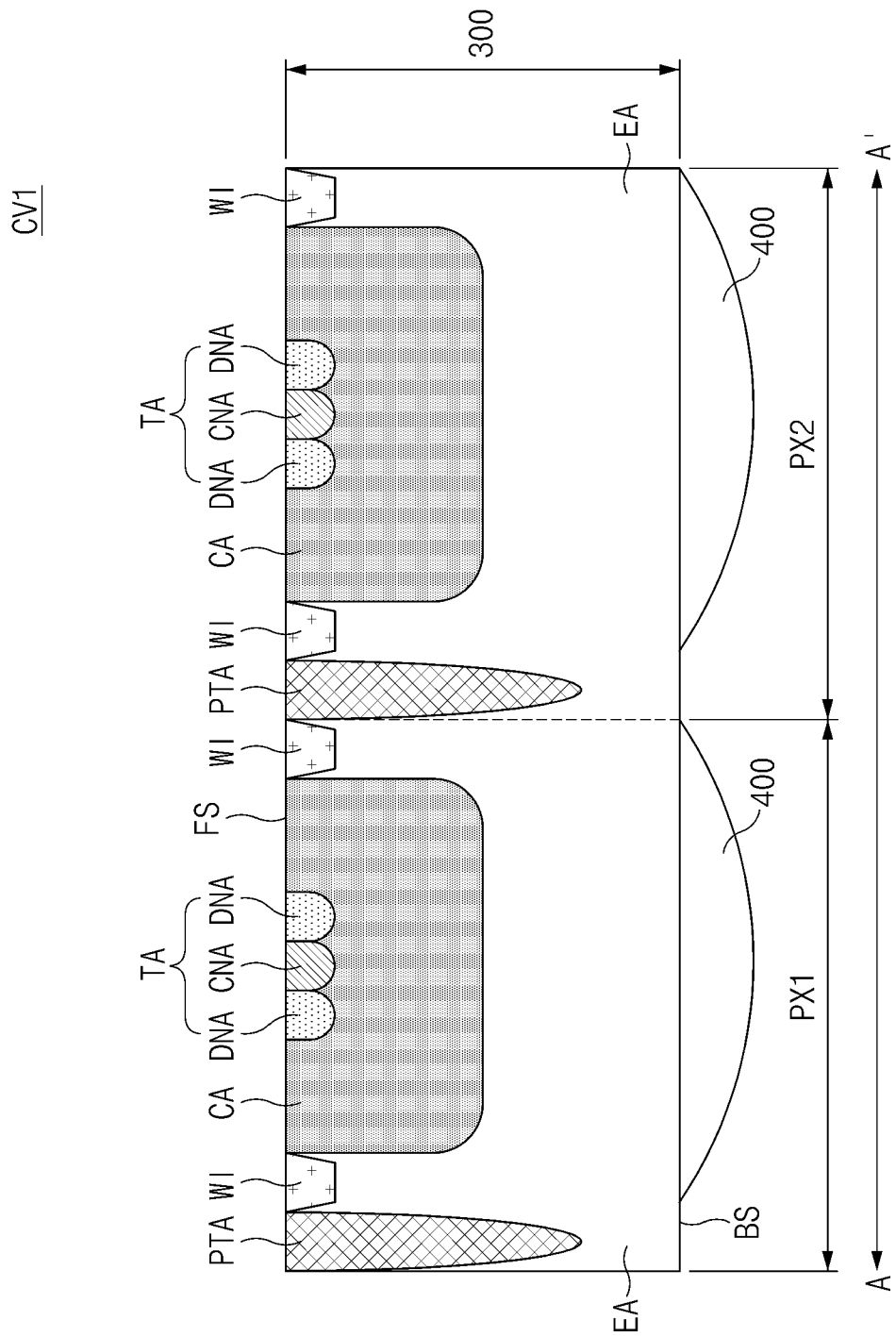
FIG. 4 is a diagram illustrating an example of a cross-section taken along a first line A-A' illustrated in FIG. 2.
Figure 5:
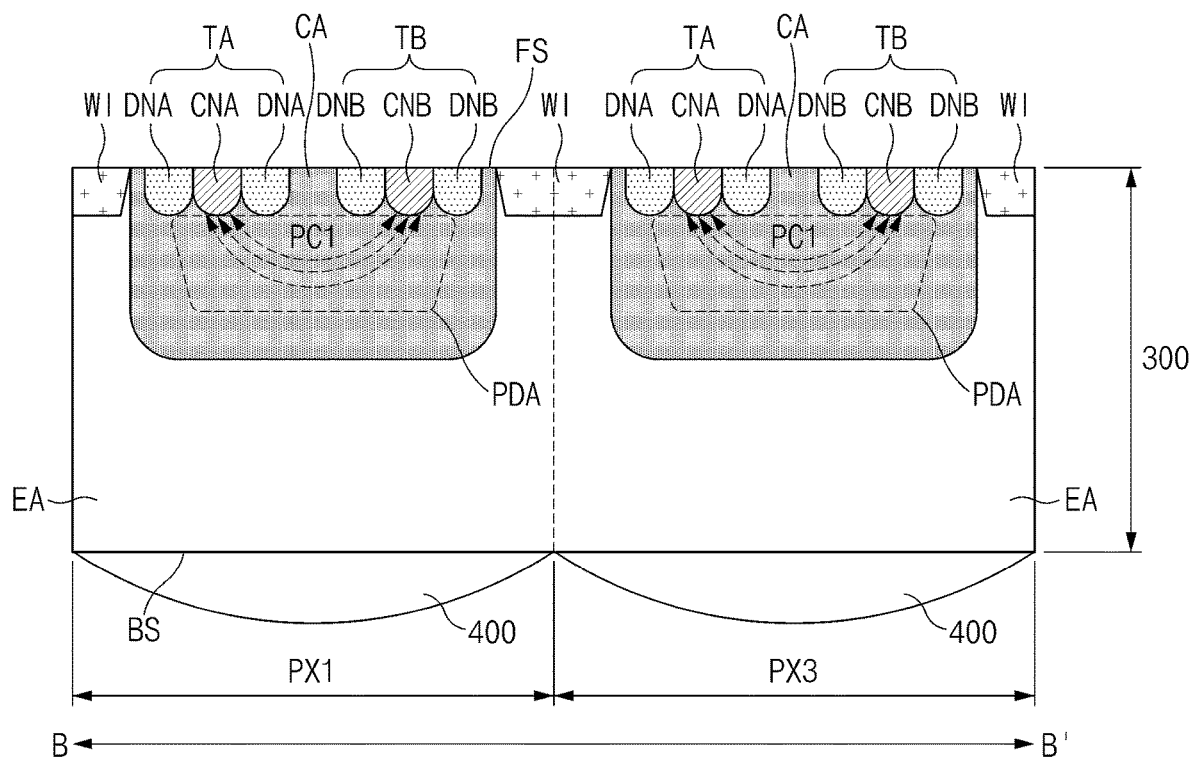
FIG. 5 is a diagram illustrating an example of a cross-section taken along a second line B-B' illustrated in FIG. 2.

FIG. 4 is a diagram illustrating an example of a cross-section taken along a first line A-A' illustrated in FIG. 2. FIG. 5 is a diagram illustrating an example of a cross-section taken along a second line B-B' illustrated in FIG. 2.

Referring to FIGS. 4 and 5, a first cross-section CV1 of FIG. 4 corresponds to a cross-section taken by cutting the first and second pixels PX1 and PX2 along a first line A-A', and a second cross-section VC2 of FIG. 5 corresponds to a cross-section taken by cutting the first and third pixels PX1 and PX3 along a second line B-B'. The first and second cross-sections CV1 and CV2 will be discussed together below for convenience of description.

A substrate 300 may include the first tap TA, the second tap TB, the capping region CA, the well isolation region WI and the pixel transistor region PTA, as shown in FIG. 2. In addition, the substrate 300 may include an epitaxial region EA to support the components.

The substrate 300 may be a semiconductor substrate. In some implementations, the substrate 300 may be formed by growing a p-type or n-type epitaxial layer in a base substrate. That is, the substrate 300 may be formed by forming the first tap TA, the second tap TB, the capping region CA, the well isolation region WI and the pixel transistor region PTA in the epitaxial layer, and then removing the base substrate, leaving the substrate 300. The epitaxial region EA may indicate the region where the first tap TA, the second tap TB, the capping region CA, the well isolation region WI and the pixel transistor region PTA are formed and remain in the epitaxial layer.

The substrate 300 may have a front side FS and a back side BS, which face each other. Light reflected from the target object 1 may be incident on the substrate 300 through the back side BS of the substrate 300 through a microlens 400. In some implementations of the disclosed technology, the image sensing device ISD may use the back-side illumination (BSI) method.

The first and second taps TA and TB may be formed to a predetermined depth from the front side FS. FIGS. 4 and 5 illustrate that the control nodes CNA and CNB and the detection nodes DNA and DNB are formed to the same depth. However, the scope of the disclosed technology is not limited thereto.

The capping region CA may be formed to a depth from the front side FS that is deeper than that of the first and second taps TA and TB from the front side FS and have a shape structured to surround the first and second taps TA and TB. In some implementations, the lower portion of the capping region CA does not reach the back side BS and is spaced apart from the back side BS by a predetermined distance. Each of the capping region CA, the first control node CNA and the second control node CNB may be doped with a P-type impurity. However, the doping concentration of the capping region CA may be lower than the doping concentrations of the first and second control nodes CNA and CNB.

Since the quantity of majority carriers increases with the increase in doping concentration, the specific resistance may be lowered, allowing a current to easily flow. That is, each of the first and second control nodes CNA and CNB corresponds to a region through which a current may easily flow because the region has a lower specific resistance than the capping region CA.

The well isolation region WI may be disposed between the capping region CA and the pixel transistor region PTA within one pixel or between the capping regions CA of the pixels PX1 and PX3 adjacent to each other, and electrically isolate the adjacent regions from each other.

The epitaxial region EA may be doped with an n-type impurity or p-type impurity.

When the epitaxial region EA is doped with an n-type impurity, a depletion region may be formed by a PN junction at the boundary between the n-type epitaxial region EA and the p-type capping region CA. In the depletion region, charge carriers (i.e. holes and electrons) are not present. Therefore, the first pixel current PC1 hardly flows through the epitaxial region EA, but flows only into the capping region CA.

When the epitaxial region EA is doped with a p-type impurity and has a lower doping concentration than the capping region CA, a difference in the specific resistance may occur at the boundary between the p-type epitaxial region EA and the p-type capping region CA. When a difference in doping concentration between the epitaxial region EA and the capping region CA is larger than a difference that is obtained experimentally, a current flowing through the capping region CA may not pass through the boundary between the epitaxial region EA and the capping region CA. Therefore, the first pixel current PC1 hardly flows through the epitaxial region EA, but flows only into the capping region CA.

As illustrated in FIG. 5 (the second cross-section CV2), the first pixel current PC1 may not flow to the epitaxial region EA, but flow only through the capping region CA between the first and second control nodes CNA and CNB.

The microlens 400 disposed under the back side BS may have an optical axis that overlaps the first and second taps TA and TB, while passing through the intermediate position between the first and second taps TA and TB (for example, the center between the first and second taps TA and TB). The microlens 400 may concentrate light reflected from the target object 1 into an area around the intermediate position between the first and second taps TA and TB. Furthermore, when modulated light has a wavelength band corresponding to infrared light, incident light may penetrate to a relatively large depth, such that a dense-photocharge region PDA is formed closer to the front side FS than the back side BS on which the light is incident. The dense-photocharge region PDA may indicate a region where the density of photocharges generated by the photoelectric effect is equal to or higher than a predetermined density.

When the capping region CA is formed to include the dense-photocharge region PDA as illustrated in FIG. 5, the first pixel current PC1 may migrate most of photocharges generated by the dense-photocharge region PDA, such that the photocharges are captured by the first or second tap TA or TB. Thus, the photoelectric conversion efficiency may be improved to increase the sensitivity. Furthermore, when the capping region CA is not formed at an unnecessary position other than the dense-photocharge region PDA, the magnitude of the first pixel current PC1 may be minimized to reduce the power consumption of the image sensing device ISD.

Furthermore, since the capping region CA has a shape structured to surround the detection nodes DNA and DNB as well as the control nodes CNA and CNB, the photocharges migrated by the first pixel current PC1 may be effectively captured by the detection nodes DNA and DNB.

Figure 6:
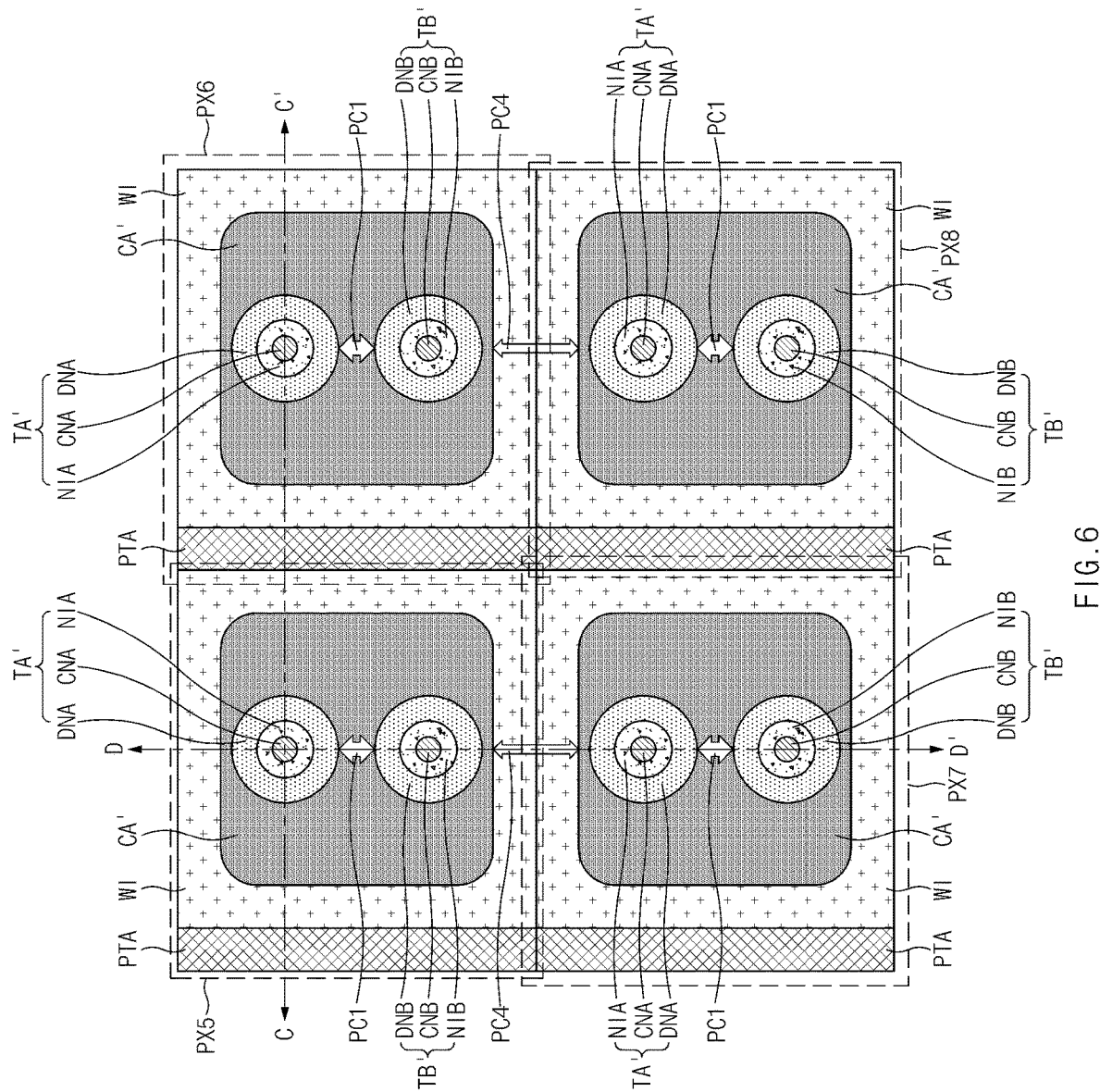
FIG. 6 is a diagram briefly illustrating another example of the layout of the pixel illustrated in FIG. 1.

FIG. 6 is a diagram briefly illustrating another example of the layout of the pixel illustrated in FIG. 1.

Referring to FIG. 6, each of fifth to eighth pixels PX5 to PX8 may be any one of the pixels PX illustrated in FIG. 1. For convenience of description, only four pixels PX5 to PX8 are illustrated in FIG. 6 by way of example. In some implementations, other pixels arranged in the pixel array 30 may have the same structure and operate in the same way as the pixels PX5 to PX8 illustrated in FIG. 6.

In some implementations, the fifth to eighth pixels PX5 to PX8 have substantially the same structures as the first to fourth pixels PX1 to PX4, respectively, except some differences discussed below.

The fifth to eighth pixels PX5 to PX8 may have the same structure as one another. For example, the fifth pixel PX5 may include a first tap TA', a second tap TB', a capping region CA', a well isolation region WI and a pixel transistor region PTA. The structures and operations of the well isolation region WI and the pixel transistor region PTA are the same as those described with reference to FIG. 2.

The first tap TA' may further include a first node isolation region NIA disposed between the first control node CNA and the first detection node DNA. That is, the first node isolation region NIA may have a ring shape that is disposed inside the first detection node DNA while surrounding the first control node CNA.

The second tap TB' may further include a second node isolation region NIB disposed between the second control node CNB and the second detection node DNB. That is, the second node isolation region NIB may have a ring shape that is disposed inside the second detection node DNB while surrounding the second control node CNB.

Each of the first and second node isolation regions NIA and NIB may electrically isolate the control node and the detection node from each other, thereby reducing noise by blocking electrical charges irrelevant to photocharges from being transferred from the control node to the detection node.

In some implementations, the first and second node isolation regions NIA and NIB are formed of the same material as the well isolation region WI and are fabricated through the same process as the well isolation region WI.

Figure 7:
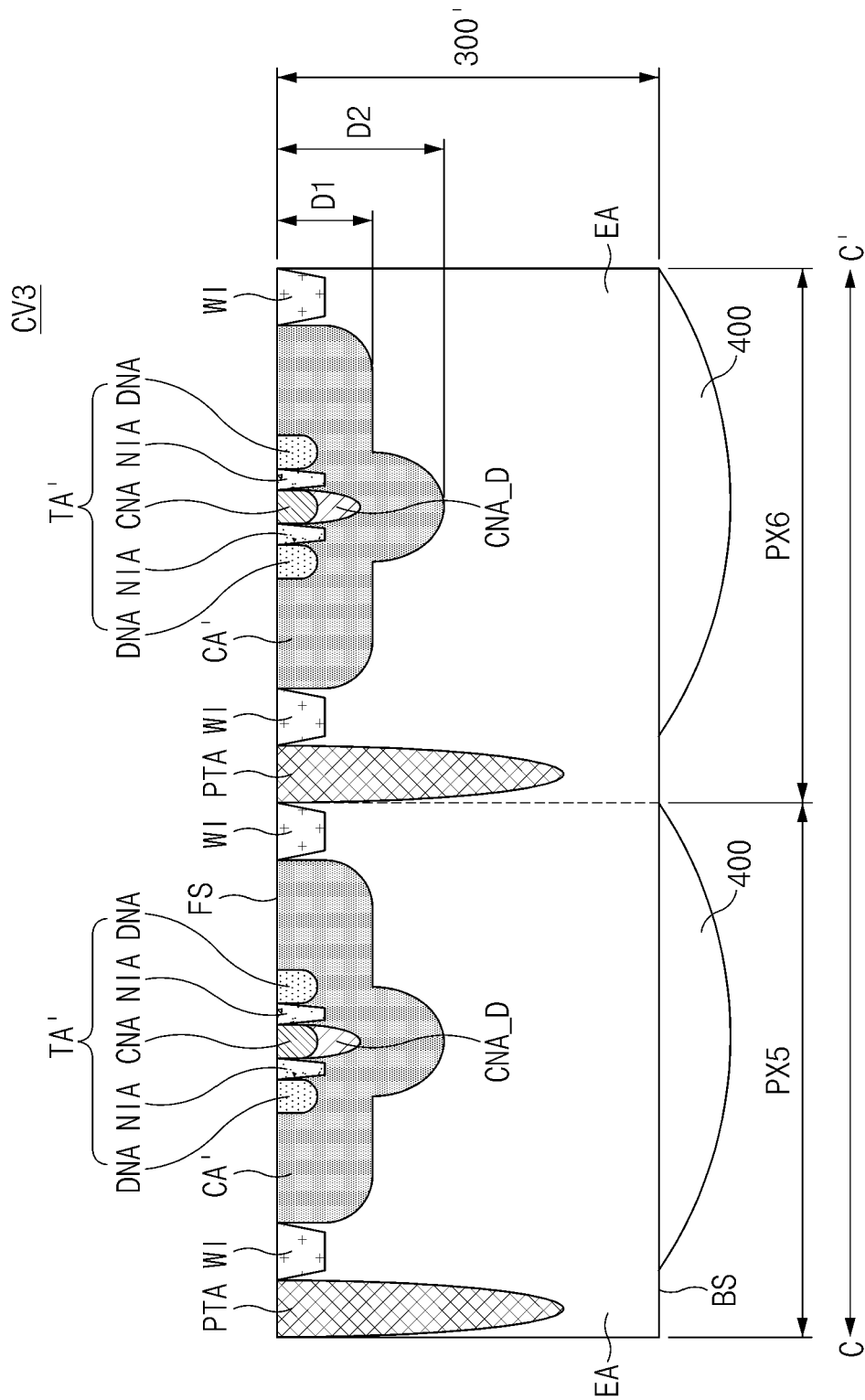
FIG. 7 is a diagram illustrating an example of a cross-section taken along a third line C-C' illustrated in FIG. 6.
Figure 8:
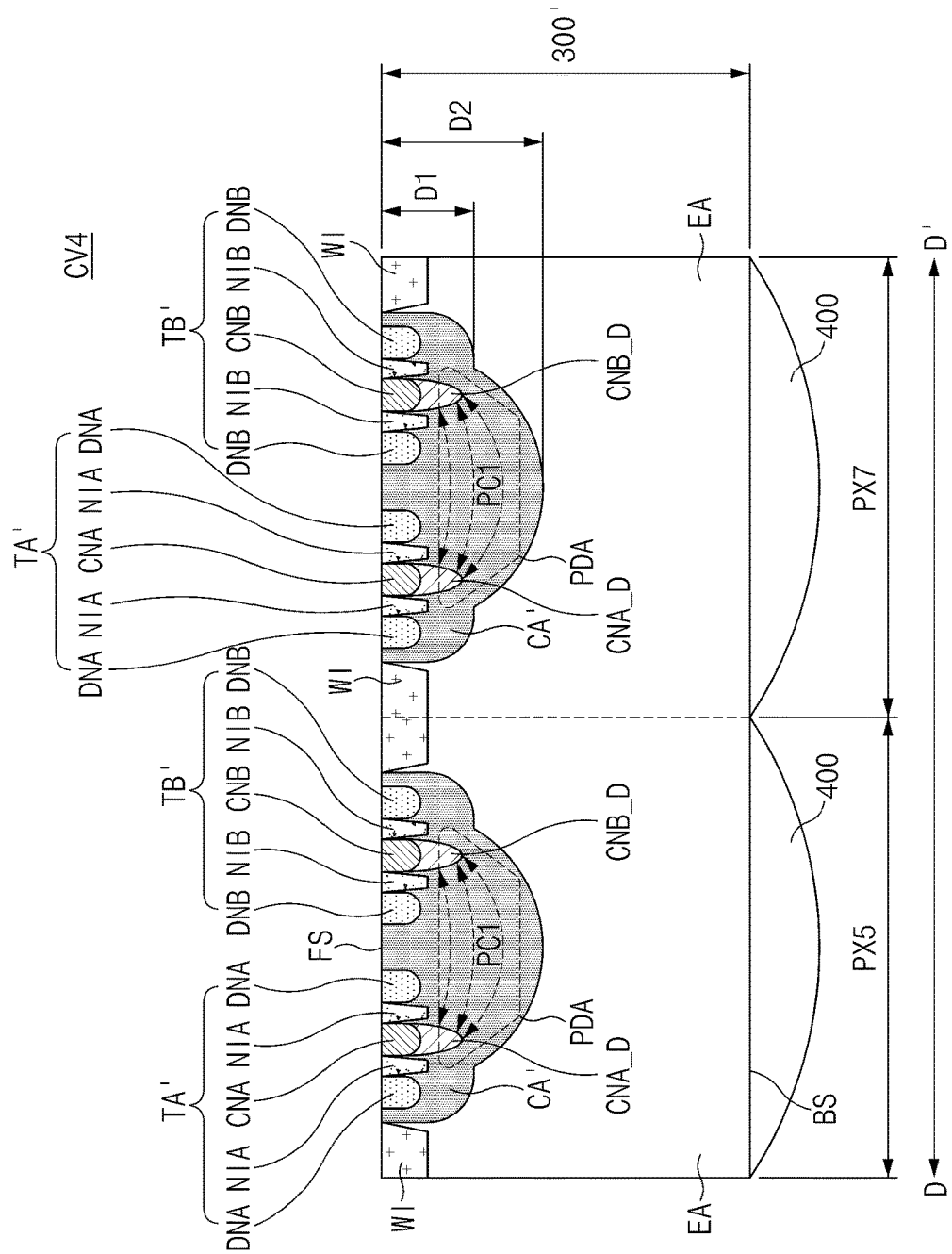
FIG. 8 is a diagram illustrating an example of a cross-section taken along a fourth line D-D' illustrated in FIG. 6.

FIG. 7 is a diagram illustrating an example of a cross-section taken along a third line illustrated in FIG. 6. FIG. 8 is a diagram illustrating an example of a cross-section taken along a fourth line illustrated in FIG. 6.

Referring to FIGS. 7 and 8, a third cross-section CV3 of FIG. 7 corresponds to a cross-section taken by cutting the fifth and sixth pixels PX5 and PX6 along a third line C-C', and a fourth cross-section CV4 of FIG. 8 corresponds to a cross-section taken by cutting the fifth and seventh pixels PX5 and PX7 along a fourth line D-D'. The third and fourth cross-sections CV3 and CV4 will be referred together below for convenience of description.

A substrate 300' may include the first tap TA', the second tap TB', the capping region CA', the well isolation region WI and the pixel transistor region PTA, as shown in FIG. 6. In addition, the substrate 300' may include the epitaxial region EA to support the components. The third and fourth cross-sections CV3 and CV4 have substantially the same structures as the first and second cross-sections CV1 and CV2, respectively, except some differences as discussed below.

As described with reference to FIG. 6, the first and second node isolation regions NIA and NIB may be formed through substantially the same fabrication process as the well isolation region WI, and the first and second node isolation regions NIA and NIB may have a larger depth from the front side FS than that of the control nodes CNA and CNB and the detection nodes DNA and DNB from the front side FS.

Under the first control node CNA, a first auxiliary control node CNA_D may be disposed, which has a larger depth from the front side FS than that of the first control node CNA from the front side FS while overlapping the first control node CNA. A bottom side or a lower portion of the capping region CA' may be formed to a larger depth from the front side FS than that of the bottom side of the first auxiliary control node CNA_D from the front side FS. The first auxiliary control node CNA_D may be a region doped with a P-type impurity, and have a doping concentration lower than that of the first control node CNA and higher than that of the capping region CA'. That is, the first auxiliary control node CNA_D may have a specific resistance higher than that of the first control node CNA and lower than that of the capping region CA', and an electric potential gradient may be formed, in which the electric potential increases in order of the first control node CNA, the first auxiliary control node CNA_D and the capping region CA'. The first auxiliary control node CNA_D may have a larger depth from the front side FS than that of the first node isolation region NIA from the front side FS. Therefore, the first pixel current PC1 may smoothly flow through the first control node CNA, the first auxiliary control node CNA_D and the capping region CA'.

Under the second control node CNB, a second auxiliary control node CNB_D may be disposed, which has a larger depth from the front side FS than that of the second control node CNB from the front side FS while overlapping the second control node CNB. The bottom side of the capping region CA' may be formed to a larger depth from the front side FS than that of the bottom side of the second auxiliary control node CNB_D from the front side FS. The second auxiliary control node CNB_D may be a region doped with a P-type impurity, and have a doping concentration lower than that of the second control node CNB and higher than that of the capping region CA'. That is, the second auxiliary control node CNB_D may have a specific resistance higher than that of the second control node CNB and lower than that of the capping region CA', and an electric potential gradient may be formed, in which the electric potentials increase in order of the second control node CNB, the second auxiliary control node CNB_D and the capping region CA'. The second auxiliary control node CNB_D may have a larger depth from the front side FS than that of the second node isolation region NIB from the front side FS. Therefore, the first pixel current PC1 may smoothly flow through the second control node CNB, the second auxiliary control node CNB_D and the capping region CA'.

In some implementations, the capping region CA' may have portions that have different depths. In one example, the capping region CA' may have a stepped structure whose depth from the front side FS gradually decreases from the center of the capping region CA' to the edge of the capping region CA'. That is, the capping region CA' may be formed through a first implant process for forming a P-type impurity region corresponding to a first depth D1 and a second implant process for forming a P-type impurity region corresponding to a second depth D2. The P-type impurity region formed through the first implant process may have a larger plan area than the p-type impurity region formed through the second implant process.

Although the capping region CA' has a stepped structure, the capping region CA' may be formed to include the dense-photocharge region PDA. That is, the area and depth of the P-type impurity region formed through the first implant process and the area and depth of the P-type impurity region formed through the second implant process may be experimentally determined so that the dense-photocharge region PDA is included in the capping region CA'.

When the capping region CA' has a stepped structure, the capping region CA' may be formed to correspond to the shape of the dense-photocharge region PDA. Therefore, the magnitude of the first pixel current PC1 may be minimized to further reduce the power consumption of the image sensing device ISD.

In some implementations of the disclosed technology, the capping region CA' is formed through two implant processes. However, the disclosed technology is not limited thereto, and the capping region may be formed through a plurality of implant processes (for example, three or more implant processes) of forming P-type impurity regions having different areas and depths. Thus, the capping region may be formed in a more similar shape to the shape of the dense-photocharge region PDA.

The node isolation regions NIA and NIB, the first and second auxiliary control nodes CNA_D and CNB_D, and the capping region CA' having a stepped structure, which have been described with reference to FIGS. 6 to 8, are not necessarily implemented together. The node isolation regions NIA and NIB, the first and second auxiliary control nodes CNA_D and CNB_D and the capping region CA' may be implemented independently of one another, or the features of at least some of the node isolation regions NIA and NIB, the first and second auxiliary control nodes CNA_D and CNB_D and the capping region CA' may be combined. For example, the image sensing device based on some embodiments of the disclosed technology may not include the isolation regions NIA and NIB, and may include the first and second auxiliary control nodes CNA_D and CNB_D and the capping region CA' having a stepped structure.

While various embodiments have been described above, it will be understood to those skilled in the art that the embodiments described are examples only. Variations and enhancements to the disclosed embodiments and other embodiments can be made based on what is disclosed in this patent document.

What is claimed is:

1. An image sensing device comprising:
   a substrate including a back side structured to receive incident light and a front side facing away from the back side;
   imaging pixels configured to receive the incident light from the back side and each structured to produce photocharge in response to the received incident light at each imaging pixel;
   a plurality of taps located at a first depth from the front side of the substrate and configured to generate a current within the substrate and capture photocharge which is generated by the imaging pixels and migrated by the current, wherein the plurality of taps are distributed in the imaging pixels such that two or more of the plurality of taps are located within each imaging pixel; and
   a capping region formed in each imaging pixel and structured to surround the two or more taps included in each imaging pixel, wherein a lower portion of the capping region is spaced apart from the back side by a distance,
   wherein the capping region includes, at a center of the capping region, a first portion structured to be formed to a second depth from the front side, and at a center of each of the plurality of taps, a second portion structured to be formed to a third depth from the front side that is smaller than the second depth.

2. The image sensing device of claim 1, wherein each imaging pixel of the image sensing device including the two or more taps comprises:
   a first control node and a second control node spaced apart from each other and configured to generate the current within the substrate; and
   a first detection node disposed adjacent to the first control node and a second detection node disposed adjacent to the second control node, each of the first detection node and the second detection node configured to capture the photocharge generated by each imaging pixel in response to the incident light at the imaging pixel.

3. The image sensing device of claim 2, wherein the capping region, the first control node and the second control node are doped with a first conductive-type impurity.

4. The image sensing device of claim 2, wherein the capping region has a lower doping concentration than the first control node and the second control node.

5. The image sensing device of claim 2, further comprising:
a first node isolation region disposed between the first control node and the first detection node to electrically isolate the first control node and the first detection node from each other; and
a second node isolation region disposed between the second control node and the second detection node to electrically isolate the second control node and the second detection node from each other.

6. The image sensing device of claim 5, further comprising a microlens disposed under the back side and arranged to overlap the taps.

7. The image sensing device of claim 2, further comprising:
a first auxiliary control node disposed under the first control node, and having a lower doping concentration than the first control node; and
a second auxiliary control node disposed under the second control node, and having a lower doping concentration than the second control node.

8. The image sensing device of claim 7, wherein lower portions of the first and second auxiliary control nodes are each formed to a fourth depth from the front side that is greater than the first depth from the front side.

9. The image sensing device of claim 1, further comprising:
a pixel transistor region comprising pixel transistors configured to generate a pixel signal based on the captured photocharges; and
an epitaxial region disposed between the pixel transistor region and the capping region.

10. The image sensing device of claim 9, wherein the epitaxial region is disposed between the capping region of a first pixel and the capping region of a second pixel adjacent to the first pixel.

11. The image sensing device of claim 9, wherein the epitaxial region is doped with a first conductive-type impurity.

12. The image sensing device of claim 11, wherein the epitaxial region has a lower doping concentration than the capping region.

13. The image sensing device of claim 9, wherein the epitaxial region is doped with a second conductive-type impurity.

14. An image sensing device comprising:
a substrate; and
a first pixel and a second pixel adjacent to each other, disposed at the substrate and structured to convert incident light into electrical signals, respectively,
wherein each of the first and second pixels comprises:
a plurality of taps each configured to generate a current within the substrate, and capture photocharges that are generated by the incident light and migrated by the current; and
a capping region structured to surround the taps,
wherein the capping region of the first pixel and the capping region of the second pixel are physically isolated from each other, and
wherein the capping region includes, at a center of the capping region, a first portion structured to be formed to a first depth from a front side of the substrate, and at a center of each of the plurality of taps, a second portion structured to be formed to a second depth from the front side that is smaller than the first depth.

15. The image sensing device of claim 14, further comprising an epitaxial region disposed between the capping region of the first pixel and the capping region of the second pixel.

16. The image sensing device of claim 15, wherein the capping region and the epitaxial region are doped with a first conductive-type impurity, and
the epitaxial region has a lower doping concentration than the capping region.

17. The image sensing device of claim 15, wherein the capping region is doped with a first conductive-type impurity, and the epitaxial region is doped with a second conductive-type impurity different from the first conductive-type impurity.

* * * * *